(12) United States Patent
Lavery et al.

(10) Patent No.: US 11,476,876 B1
(45) Date of Patent: Oct. 18, 2022

(54) CALIBRATION SIGNAL GENERATION FOR A SAMPLING ANALOG TO DIGITAL CONVERTER

(71) Applicant: BAE Systems Information and Electronic Systems Integration Inc., Nashua, NH (US)

(72) Inventors: Richard J. Lavery, Huntington, NY (US); Peter Ladubec, Jr., Centereach, NY (US)

(73) Assignee: BAE Systems Information and Electronic System Integration Inc., Nashua, NH (US)

( * ) Notice: Subject to any disclaimer, the term of this patent is extended or adjusted under 35 U.S.C. 154(b) by 0 days.

(21) Appl. No.: 17/544,210

(22) Filed: Dec. 7, 2021

(51) Int. Cl.
| | |
|---|---|
| *H04B 17/00* | (2015.01) |
| *H04B 1/00* | (2006.01) |
| *H04B 1/16* | (2006.01) |
| *H04B 17/11* | (2015.01) |
| *H04B 17/21* | (2015.01) |

(52) U.S. Cl.
CPC ......... *H04B 1/0032* (2013.01); *H04B 1/1676* (2013.01); *H04B 17/11* (2015.01); *H04B 17/21* (2015.01)

(58) Field of Classification Search
CPC .. H04B 1/0007; H04B 1/0028; H04B 1/0032; H04B 1/16; H04B 1/1676; H04B 17/11
See application file for complete search history.

(56) References Cited

U.S. PATENT DOCUMENTS

| | | | | |
|---|---|---|---|---|
| 7,932,845 B2 * | 4/2011 | Sheng | ................ | H04N 5/4446 341/120 |
| 9,444,559 B2 * | 9/2016 | Jiang | ..................... | H04B 17/21 |
| 9,537,520 B2 * | 1/2017 | Myoung | ............... | H04B 17/14 |

OTHER PUBLICATIONS

Ali, et al., "A 14b 1GS/s RF Sampling Pipelined ADC with Background Calibration," IEEE International Solid State Circuits Conference Digest of Technical Papers (ISSCC), 2014, pp. 482 483.

(Continued)

*Primary Examiner* — Tuan Pham
(74) *Attorney, Agent, or Firm* — Finch & Maloney PLLC (57) ABSTRACT

Techniques are provided for the generation of a calibration signal for use on an analog to digital converter (ADC). A system implementing the techniques according to an embodiment includes a calibration signal generator configured to generate a calibration tone, located in a first frequency band, in response to a calibration enable signal. The system also includes a signal summing circuit configured to generate an ADC input signal as a sum of a received signal and the calibration tone. The received signal is located in a second frequency band. The system further includes an ADC circuit configured to convert the ADC input signal to a baseband digital output signal and to perform self-calibration, based on the calibration tone, in response to the calibration enable signal. The frequency bands and the amplitude of the calibration tone are chosen to reduce interference between the received signal and the calibration tone.

20 Claims, 4 Drawing Sheets (56) References Cited

OTHER PUBLICATIONS

Ali, et al., "A 12-b 18-GS/s RF Sampling ADC With an Integrated Wideband Track-and-Hold Amplifier and Background Calibration," IEEE Journal of Solid-State Circuits, vol. 55, No. 12, Dec. 2020, pp. 3210-3224.

Li, Jipeng and Moon, Un-Ku," Background Calibration Techniques for Multistage Pipelined ADCs With Digital Redundancy," IEEE Transactions on Circuits and Systems-II: Analog and Digital Signal Processing, vol. 50, No. 9, Sep. 2003. pp 531-538.

* cited by examiner

CALIBRATION SIGNAL GENERATION FOR A SAMPLING ANALOG TO DIGITAL CONVERTER

STATEMENT OF GOVERNMENT INTEREST

This invention was made with United States Government assistance under Contract No. FA8232-17-D-0027 and FA8232-21-F-0031, awarded by the United States Government. The United States Government has certain rights in this invention.

FIELD OF DISCLOSURE

The present disclosure relates to calibration of analog to digital converters (ADCs).

BACKGROUND

RF sampling ADCs are often required to operate at relatively high sampling rates, for example greater than one gigahertz. In order to achieve these data conversion rates, the ADCs are typically implemented as multiple sub-converters that are interleaved to sample the signal at smaller time offsets relative to each other. This type of architecture generally requires periodic gain calibration and time skew calibration.

Although the following Detailed Description will proceed with reference being made to illustrative embodiments, many alternatives, modifications, and variations thereof will be apparent in light of this disclosure.

DETAILED DESCRIPTION

Techniques are provided herein for generating and utilizing a calibration signal for use on a sampling ADC. Although the techniques can be used in a number of ADC applications, they are particularly useful in the context of an interleaved RF sampling ADC. As noted previously, RF sampling ADCs are often required to operate at sampling rates that exceed one gigahertz. To achieve these high conversion rates, the ADCs may comprise multiple, interleaved, sub-converters, each of which sample the signal at a small time offset or skew relative to one another. This interleaved architecture generally requires periodic gain calibration and time skew calibration to be sure that the sub-converters remain synchronized, for example as the circuit operates over varying temperature. Many such interleaved ADCs are provided with internal calibration circuitry, so as to be self-calibrating. The self-calibration process, however, generally requires that a continuous signal be provided at the input to the ADC for some specified minimum number of converter clock cycles so that internal calibration coefficients have time to converge. While this requirement may be acceptable for receiver systems that process continuous signals, it poses a problem for systems that process low duty cycle pulsed waveforms or short duration packet waveforms which can arrive at unpredictable times. For such systems, which require near 100 percent availability of the receiver and ADC to capture signals of interest whenever they may occur, it is not feasible to periodically take the receiver offline for a block of time to provide a calibration signal.

To this end, and in accordance with an embodiment of the present disclosure, a calibration system is disclosed which provides a calibration signal to a self-calibrating ADC which can be continuous or near-continuous (e.g., the calibration signal is provided periodically and for a sufficient duration to meet specified self-calibration requirements). The calibration system is also configured to generate the calibration signal in a manner that does not interfere with signals of interest that are to be captured by the RF receiver. In some embodiments, the calibration system may advantageously re-purpose components of the self-calibrating ADC, as will be described in greater detail below.

The disclosed calibration system can be used, for instance, with receiver systems in a wide variety of applications including, for example, radar systems and communication systems that can be deployed on aircraft (manned and unmanned), guided munitions and projectiles, space-based systems, electronic warfare systems, and other communication systems including cellular telephones, and smartphones, although other applications will be apparent. In a more general sense, the disclosed techniques are useful for any systems in which high frequency and high bandwidth signals are received, transmitted, or processed. In accordance with an embodiment, a calibration system includes a calibration signal generator configured to generate a calibration tone in response to a calibration enable signal. The calibration tone is located in a first frequency band. The system also includes a signal summing circuit configured to generate an ADC input signal as a sum of a received signal and the calibration tone. The received signal is located in a second frequency band. The system further includes an ADC circuit configured to convert the ADC input signal to a baseband digital output signal. The ADC circuit is also configured to perform self-calibration, based on the calibration tone, in response to the calibration enable signal. The system further includes a calibration controller configured to select the first frequency band, and an amplitude of the calibration tone, to reduce interference between the received signal and the calibration tone, as will be described in greater detail below.

It will be appreciated that the techniques described herein may provide improved receiver operation by enabling ADC calibration whether the signals of interest are continuous, pulsed, or otherwise intermittent, compared to existing systems that require the receiver to be taken offline periodically when operating on non-continuous signals. The disclosed techniques can provide improved reliability and signal processing capabilities in a variety of microwave RF applications. Numerous embodiments and applications will be apparent in light of this disclosure.

System Architecture

Figure 1:
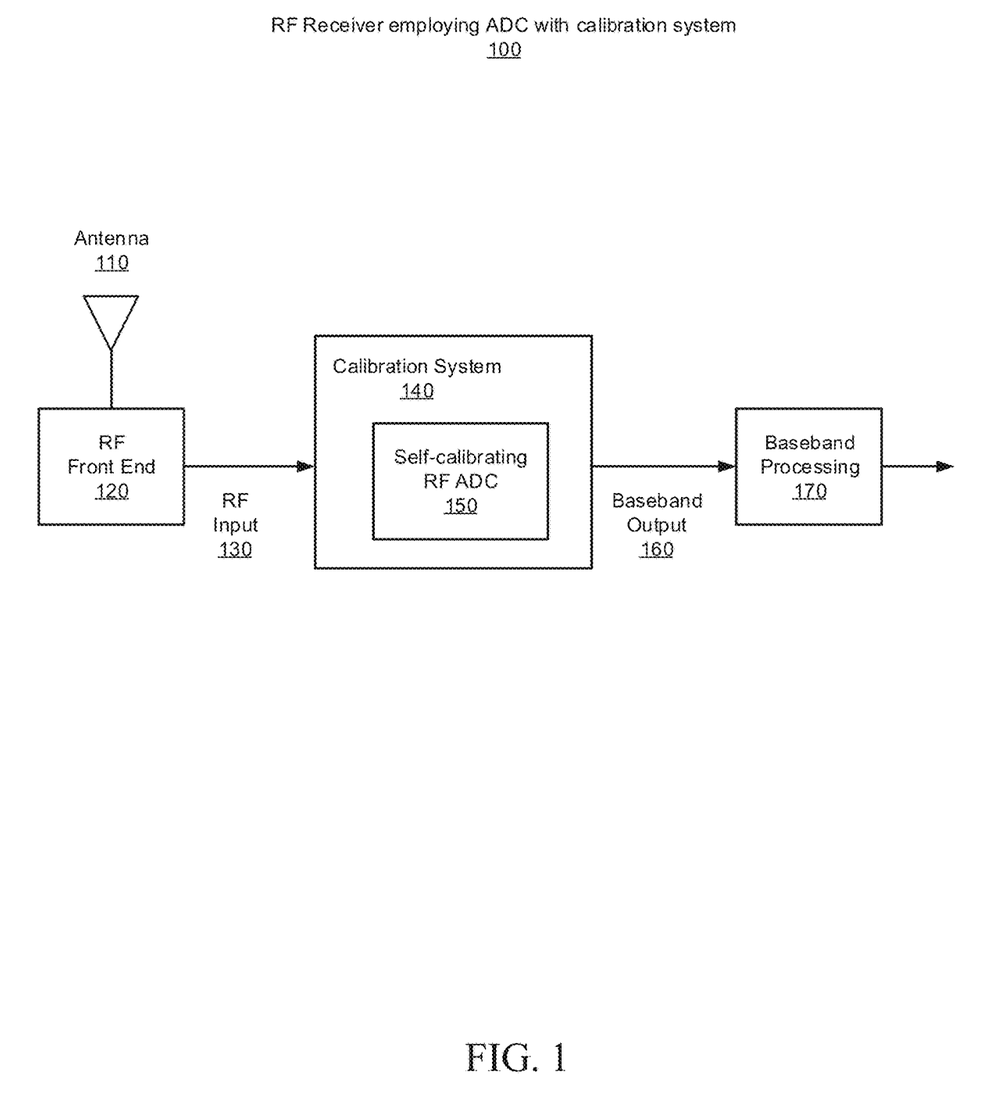
FIG. 1 illustrates an RF receiver employing an ADC with calibration system, in accordance with certain embodiments of the present disclosure.

FIG. 1 illustrates an RF receiver 100 employing an ADC with calibration system, in accordance with certain embodiments of the present disclosure. The RF receiver 100 is shown to include an antenna 110, an RF front end 120, a calibration system 140, a self-calibrating RF ADC 150, and a baseband processor 170.

The antenna 110 is configured to receive an RF signal. The RF front end 120 is configured to pre-process or condition the received RF signal to generate an RF input signal 130. In some embodiments, the preprocessing may include one or more of automatic gain control, amplification, filtering to frequency bands of interest, or any other suitable operations, depending on the application.

The self-calibrating RF ADC 150 is configured to convert the analog RF input signal 130 to a digital baseband output signal 160. In some embodiments, the self-calibrating RF ADC 150 comprises a number of sub-converters to achieve the required analog to digital conversion rates, and mixing and filtering circuits to perform the frequency down conversion from RF to baseband. The self-calibrating RF ADC 150 further comprises circuitry to perform self-calibration among the sub-converters provided that a relatively continuous input signal is available. Operation of the self-calibrating RF ADC 150 will be described in greater detail below.

The calibration system 140 is configured to provide a calibration signal to the self-calibrating RF ADC 150 at time intervals and for sufficient durations to meet the calibration requirements of the self-calibrating RF ADC 150. Operation of the calibration system 140 will also be described in greater detail below.

The baseband processor 170 is configured to perform any desired operations on the digital baseband output signal 160, depending on the application. For example, in a radar system, the baseband processor 170 may perform threat detection and localization functions based on received radar pulses encoded in the baseband signal 160. As another example, in a communication system, the baseband processor 170 may perform signal demodulation and/or decoding of information contained in data packets transmitted in the baseband signal 160.

Figure 2:
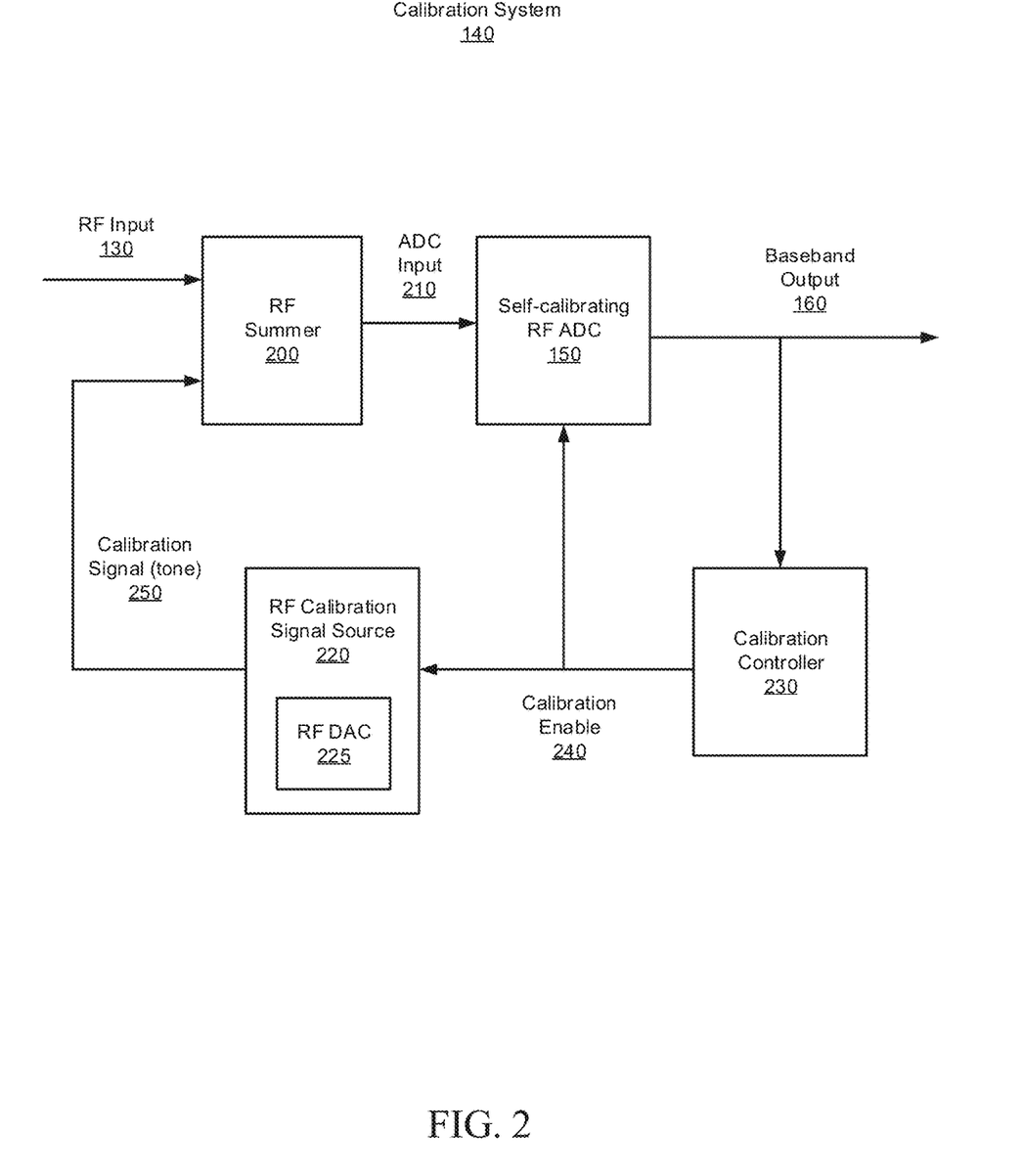
FIG. 2 is a block diagram of the calibration system of FIG. 1, configured in accordance with certain embodiments of the present disclosure.

FIG. 2 is a block diagram of the calibration system 140 of FIG. 1, configured in accordance with certain embodiments of the present disclosure. The calibration system 140 is shown to include an RF summing circuit (summer) 200, the self-calibrating RF ADC 150, an RF calibration signal source 220, and a calibration controller 230. In some embodiments, the RF calibration signal source 220 may include an RF digital to analog converter (DAC) 225.

The RF calibration signal source 220 is configured to generate a calibration signal 250 in response to a calibration enable signal 240. In some embodiments, the calibration signal 250 may be a single frequency tone. The calibration tone is located in a first frequency band. In some embodiments, an RF DAC 225 (or RF synthesizer) is employed to convert a digital calibration signal to an analog RF calibration signal 250. In some embodiments, the RF DAC may be included as a component of the self-calibrating RF ADC circuitry and re-purposed for the calibration signal generation function.

The RF summer 200 is configured to generate an ADC input signal 210 as a sum of a received signal (RF input 130) and the calibration tone 250. The received signal is located in a second frequency band.

The self-calibrating RF ADC 150 is configured to convert the ADC input signal 210 to a baseband digital output signal 160. The self-calibrating RF ADC 150 is also configured to perform self-calibration, based on the calibration tone 250, that is embedded in the ADC input signal 210, in response to the calibration enable signal 240.

The calibration controller 230 is configured to select the first frequency band and the amplitude of the calibration tone 250 so as to reduce interference between the received signal (RF input 130) and the calibration tone 250, as will be described below. The calibration controller 230 is also configured to generate the calibration enable signal 240 at periodic intervals and for sufficient time durations to satisfy specified calibration requirements of the self-calibrating RF ADC circuit 150. In some embodiments, the calibration enable signal 240 may be generated when the calibration system 140 is initiated by a process or controller so that calibration can start when the system is turned on.

Figure 3:
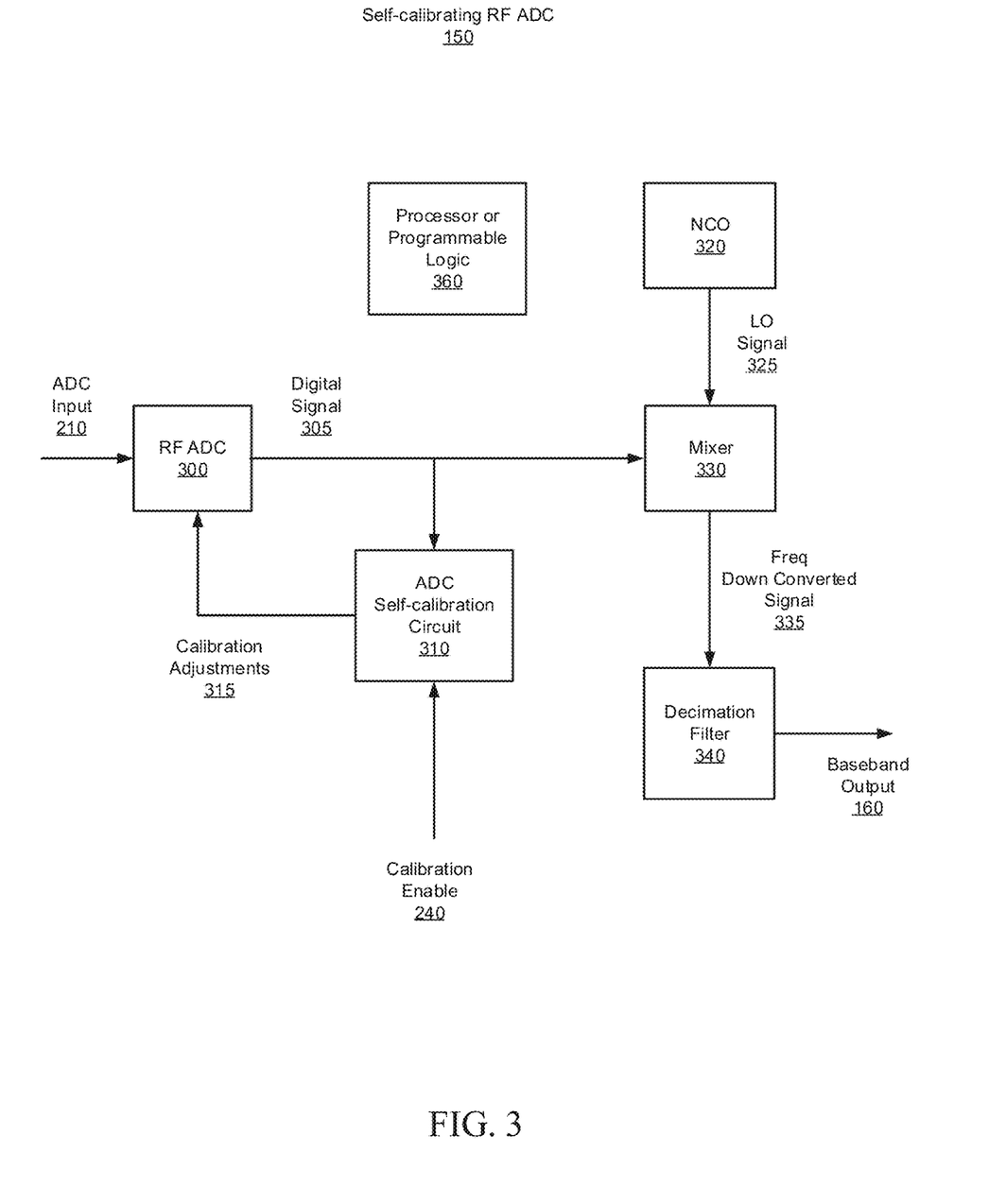
FIG. 3 is a block diagram of the self-calibrating RF ADC of FIGS. 1 and 2, configured in accordance with certain embodiments of the present disclosure.

FIG. 3 is a block diagram of the self-calibrating RF ADC 150 of FIG. 2, configured in accordance with certain embodiments of the present disclosure. The self-calibrating RF ADC 150 is shown to include an RF ADC 300, an ADC self-calibration circuit 310, a numerically controlled oscillator (NCO) 320, a mixer 330, a decimation filter 340, and a processor 360.

The RF ADC 300 is configured to convert the analog ADC input signal 210 into a digital signal 305. In some embodiments, the RF ADC 300 comprises a plurality of sub-converters configured to perform interleaved sampling of the ADC input signal to achieve a cumulative sampling rate that exceeds one gigahertz. For example, ten interleaved sub-converters, each sampling at a 100 MHz rate, with a one nanosecond offset or time skew between them, can be employed to achieve a cumulative one gigahertz sampling rate. This interleaved sampling architecture relies on the ability to maintain relatively stable gains across the sub-converters and relatively constant time skews between the sub-converters.

The ADC self-calibration circuit 310 is configured to calibrate RF ADC 300 by applying calibration adjustments to the gain and time skew of the sub-converters of the RF ADC 300. The calibration process is triggered by the calibration enable signal 240 and the adjustments may be determined, based at least in part, on the digital signal 305, using any suitable technique in light of the present disclosure.

The (NCO) 320 is configured to generate a local oscillator (LO) signal 325 to be provided to the mixer 330. The mixer 330 is configured to mix the digital signal 305 with the LO signal 325 to frequency shift the digital signal 305 down to a desired baseband frequency range. The frequency of the LO signal 325 is selected to provide the desired frequency shift.

In some embodiments, a processor (e.g., a digital signal processor) or programmable logic (e.g., a field programmable gate array) 360 may be included to control the NCO, mixer, and decimation filters so that signals of interest with known characteristics (e.g., frequency bands) can be captured.

The sampling process generates aliased images of the digital signal 305 which are then shifted in frequency by the mixing process with LO signal 325. For this reason, the decimation filter 340 is configured to generate the baseband output 160 by filtering out unwanted aliased images of the digital signal 305 (and spurs that may be generated from the mixing process) from the down converted signal 335. In some embodiments, the decimation filter 340 may also be employed for an additional purpose to filter out the calibration tone 250 from the baseband digital output signal. This is possible because the frequency of the calibration tone (e.g., in the first frequency band as described previously) is selected so that the down converted calibration tone lies outside of the frequency band of the signal of interest. For example, depending on the frequency plan of the signal (or signals) of interest, the calibration tone frequency and amplitude are chosen such that, after sampling and frequency shifting, the spectral image of the tone and any associated harmonics fall outside the passband of the decimation filter 340. In some embodiments, for example where wideband signals of interest are anticipated, the calibration tone frequency may be varied in real time to avoid interference. Additionally, the amplitude of the calibration tone is selected to avoid saturation of the ADC 300 after the calibration tone and desired signal (e.g., signals of interest) are summed together.

As previously noted, in some embodiments, the calibration system 140 may re-use components of the self-calibrating RF ADC 150, such as the RF DAC 225 and the decimation filter 340. Additionally, in some embodiments, the calibration controller 230 may be implemented as part of the processor/logic circuitry 360. In other embodiments, the calibration system 140 may employ an RF DAC and any suitable filter as components that are separate from the self-calibrating RF ADC 150. In any case, however, the disclosed techniques may leverage components of the self-calibrating RF ADC 150, such as the frequency down converter chain, which includes the NCO 320 and mixer 330, for purposes beyond their originally intended functions.

Methodology

Figure 4:
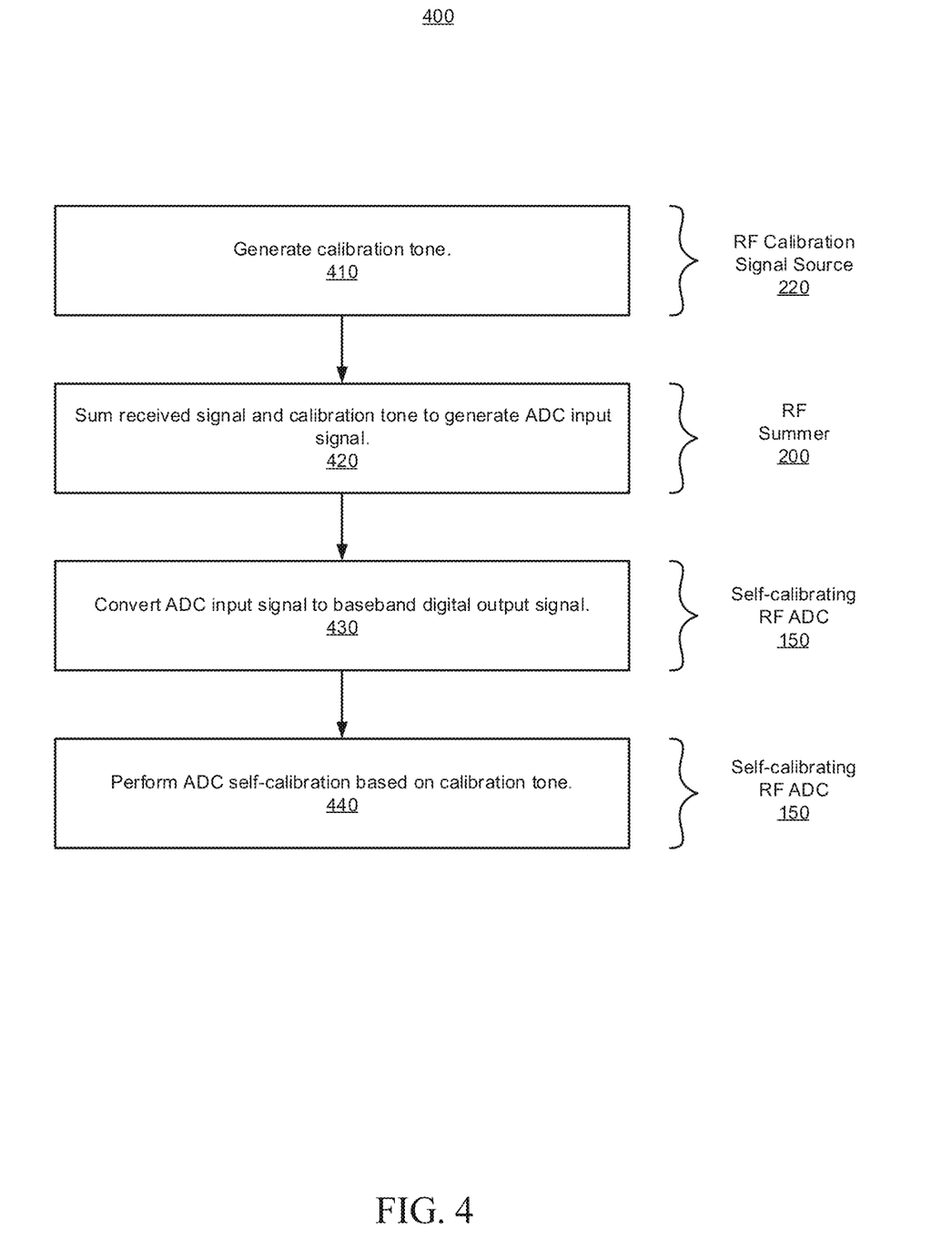
FIG. 4 is a flowchart illustrating an ADC calibration methodology, in accordance with an embodiment of the present disclosure.

FIG. 4 is a flowchart illustrating an ADC calibration methodology, in accordance with an embodiment of the present disclosure. As can be seen, example method 400 includes a number of phases and sub-processes, the sequence of which may vary from one embodiment to another. However, when considered in aggregate, these phases and sub-processes form a process for ADC calibration, in accordance with certain of the embodiments disclosed herein, for example as illustrated in FIGS. 1-3, as described above. However other system architectures can be used in other embodiments, as will be apparent in light of this disclosure. To this end, the correlation of the various functions shown in FIG. 4 to the specific components illustrated in the figures, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 400 commences, at operation 410, by generating a calibration tone in response to a calibration enable signal. The calibration tone is located in a first frequency band. The calibration enable signal is generated at periodic intervals based on calibration requirements of the ADC.

At operation 420, the calibration tone is summed with a received signal to generate an input signal for the ADC. The received signal is located in a second frequency band. The first frequency band and the amplitude of the calibration tone are selected to reduce interference between the received signal and the calibration tone.

At operation 430, the ADC converts the input signal (comprising the received signal and the calibration tone) to a baseband digital output signal. The frequency band and the amplitude of the calibration tone are selected to reduce interference, in the resulting baseband digital output signal, between the received signal and the calibration tone. In some embodiments, the calibration tone is filtered out from the baseband digital output signal using a decimation filter of the ADC.

At operation 440, the ADC performs a self-calibration, using the calibration tone, in response to the calibration enable signal. In some embodiments, the self-calibration includes a gain calibration and/or a time skew calibration for each of the sub-converters.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional structures that include hardware, or a combination of hardware and software, and may comprise, for example, singly or in any combination, hardwired circuitry, programmable circuitry such as computer processors comprising one or more individual instruction processing cores, state machine circuitry, and/or gate level logic. The circuitry may include a processor and/or controller programmed or otherwise configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), communications system, radar system, desktop computers, laptop computers, tablet computers, servers, smartphones, etc. Other embodiments may be implemented as software executed by a programmable device. In any such hardware cases that include executable software, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a calibration system for an analog to digital converter (ADC), the calibration system comprising: a calibration signal generator configured to generate a calibration tone in response to a calibration enable signal, the calibration tone located in a first frequency band; a signal summing circuit configured to generate an ADC input signal as a sum of a received signal and the calibration tone, the received signal located in a second frequency band; and an ADC circuit configured to convert the ADC input signal to a baseband digital output signal and to perform self-calibration, based on the calibration tone, in response to the calibration enable signal.

In some cases, the system further comprises a calibration controller configured to select the first frequency band and to select an amplitude of the calibration tone to reduce interference between the received signal and the calibration tone. In some such cases, the calibration controller is configured to generate the calibration enable signal at periodic intervals based on calibration requirements of the ADC circuit. In some cases, the ADC circuit comprises a decimation filter configured to filter the calibration tone from the baseband digital output signal. In some cases, the ADC circuit comprises a plurality of sub-converters configured to perform interleaved sampling of the ADC input signal to achieve a cumulative sampling rate that exceeds one gigahertz. In some cases, the self-calibration comprises a gain calibration and a time skew calibration. In some cases, the received signal is a pulsed radio frequency (RF) waveform.

Another example embodiment of the present disclosure provides a method for calibrating an analog to digital converter (ADC), the method comprising: generating a calibration tone in response to a calibration enable signal, the calibration tone located in a first frequency band; summing a received signal and the calibration tone to generate an ADC input signal, the received signal located in a second frequency band; converting, by the ADC, the ADC input signal to a baseband digital output signal; and performing, by the ADC, self-calibration based on the calibration tone in response to the calibration enable signal.

In some cases, the method further comprises selecting the first frequency band and an amplitude of the calibration tone to reduce interference between the received signal and the calibration tone. In some such cases, the method further comprises generating the calibration enable signal at periodic intervals based on calibration requirements of the ADC.

In some cases, the method further comprises filtering the calibration tone from the baseband digital output signal using a decimation filter of the ADC. In some cases, a sampling rate of the ADC exceeds one gigahertz. In some cases, the self-calibration comprises a gain calibration and a time skew calibration. In some cases, the received signal is a pulsed waveform.

Another example embodiment of the present disclosure provides an RF receiver comprising: an antenna configured to receive an RF signal; an RF front end coupled to the antenna and configured to pre-process the received RF signal to generate an RF input signal; and a calibration system comprising: a calibration signal generator configured to generate a calibration tone in response to a calibration enable signal, the calibration tone located in a first frequency band; a signal summing circuit configured to generate an ADC input signal as a sum of the RF input signal and the calibration tone, the RF input signal located in a second frequency band; and an ADC circuit configured to convert the ADC input signal to a baseband digital output signal and to perform self-calibration, based on the calibration tone, in response to the calibration enable signal.

In some cases, the RF receiver further comprises a calibration controller configured to select the first frequency band and to select an amplitude of the calibration tone to reduce interference between the RF input signal and the calibration tone. In some such cases, the calibration controller is configured to generate the calibration enable signal at periodic intervals based on calibration requirements of the ADC circuit. In some cases, the ADC circuit comprises a decimation filter configured to filter the calibration tone from the baseband digital output signal. In some cases, the ADC circuit comprises a plurality of sub-converters configured to perform interleaved sampling of the ADC input signal to achieve a cumulative sampling rate that exceeds one gigahertz. In some cases, the self-calibration comprises a gain calibration and a time skew calibration.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A calibration system for an analog to digital converter (ADC), the calibration system comprising:
   a calibration signal generator configured to generate a calibration tone in response to a calibration enable signal, the calibration tone located in a first frequency band;

a signal summing circuit configured to generate an ADC input signal as a sum of a received signal and the calibration tone, the received signal located in a second frequency band; and an ADC circuit configured to convert the ADC input signal to a baseband digital output signal and to perform self-calibration, based on the calibration tone, in response to the calibration enable signal.

2. The calibration system of claim 1, further comprising a calibration controller configured to select the first frequency band and to select an amplitude of the calibration tone to reduce interference between the received signal and the calibration tone.

3. The calibration system of claim 2, wherein the calibration controller is configured to generate the calibration enable signal at periodic intervals based on calibration requirements of the ADC circuit.

4. The calibration system of claim 1, wherein the ADC circuit comprises a decimation filter configured to filter the calibration tone from the baseband digital output signal.

5. The calibration system of claim 1, wherein the ADC circuit comprises a plurality of sub-converters configured to perform interleaved sampling of the ADC input signal to achieve a cumulative sampling rate that exceeds one gigahertz.

6. The calibration system of claim 1, wherein the self-calibration comprises a gain calibration and a time skew calibration.

7. The calibration system of claim 1, wherein the received signal is a pulsed radio frequency (RF) waveform.

8. A method for calibrating an analog to digital converter (ADC), the method comprising:
   generating a calibration tone in response to a calibration enable signal, the calibration tone located in a first frequency band;
   summing a received signal and the calibration tone to generate an ADC input signal, the received signal located in a second frequency band;
   converting, by the ADC, the ADC input signal to a baseband digital output signal; and
   performing, by the ADC, self-calibration based on the calibration tone in response to the calibration enable signal.

9. The method of claim 8, further comprising selecting the first frequency band and an amplitude of the calibration tone to reduce interference between the received signal and the calibration tone.

10. The method of claim 9, further comprising generating the calibration enable signal at periodic intervals based on calibration requirements of the ADC.

11. The method of claim 8, further comprising filtering the calibration tone from the baseband digital output signal using a decimation filter of the ADC.

12. The method of claim 8, wherein a sampling rate of the ADC exceeds one gigahertz.

13. The method of claim 8, wherein the self-calibration comprises a gain calibration and a time skew calibration.

14. The method of claim 8, wherein the received signal is a pulsed waveform.

15. A radio frequency (RF) receiver comprising:
   an antenna configured to receive an RF signal;
   an RF front end coupled to the antenna and configured to pre-process the received RF signal to generate an RF input signal; and
   a calibration system comprising:
      a calibration signal generator configured to generate a calibration tone in response to a calibration enable signal, the calibration tone located in a first frequency band;
      a signal summing circuit configured to generate an ADC input signal as a sum of the RF input signal and the calibration tone, the RF input signal located in a second frequency band; and
      an ADC circuit configured to convert the ADC input signal to a baseband digital output signal and to perform self-calibration, based on the calibration tone, in response to the calibration enable signal.

16. The RF receiver of claim 15, further comprising a calibration controller configured to select the first frequency band and to select an amplitude of the calibration tone to reduce interference between the RF input signal and the calibration tone.

17. The RF receiver of claim 16, wherein the calibration controller is configured to generate the calibration enable signal at periodic intervals based on calibration requirements of the ADC circuit.

18. The RF receiver of claim 15, wherein the ADC circuit comprises a decimation filter configured to filter the calibration tone from the baseband digital output signal.

19. The RF receiver of claim 15, wherein the ADC circuit comprises a plurality of sub-converters configured to perform interleaved sampling of the ADC input signal to achieve a cumulative sampling rate that exceeds one gigahertz.

20. The RF receiver of claim 15, wherein the self-calibration comprises a gain calibration and a time skew calibration.

\* \* \* \* \*